(12) United States Patent
Miyazawa et al.

(10) Patent No.: US 8,461,747 B2
(45) Date of Patent: *Jun. 11, 2013

(54) LIQUID EJECTING HEAD, LIQUID EJECTING APPARATUS, AND ACTUATOR DEVICE

(75) Inventors: Hiromu Miyazawa, Azumino (JP); Jiro Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/301,950

(22) Filed: Nov. 22, 2011

(65) Prior Publication Data

US 2012/0062073 A1      Mar. 15, 2012

Related U.S. Application Data

(63) Continuation of application No. 12/573,654, filed on Oct. 5, 2009, now Pat. No. 8,080,924.

(30) Foreign Application Priority Data

Oct. 6, 2008  (JP) .................................. 2008-260105
Jul. 6, 2009   (JP) .................................. 2009-160191

(51) Int. Cl.
*H01L 41/00*     (2006.01)
*B41J 2/07*      (2006.01)

(52) U.S. Cl.
USPC .......................................... 310/358; 347/68

(58) Field of Classification Search
None
See application file for complete search history.

(56) References Cited

U.S. PATENT DOCUMENTS 8,080,924 B2 *   12/2011   Miyazawa et al. ............ 310/358
2008/0224571 A1 *  9/2008  Miyazawa et al. ............ 310/358

FOREIGN PATENT DOCUMENTS

| JP | 07-169996 | 7/1995 |
| JP | 2001-223404 | 8/2001 |
| JP | 2005-019758 | 1/2005 |
| JP | 2007-268838 | 10/2007 |

OTHER PUBLICATIONS

U.S. Appl. No. 12/573,654, Aug. 22, 2011, Notice of Allowance.

* cited by examiner

*Primary Examiner* — Matthew Luu
*Assistant Examiner* — Erica Lin
(74) *Attorney, Agent, or Firm* — Workman Nydegger

(57) ABSTRACT

A liquid ejecting head including a pressure-generating chamber which communicates with a nozzle opening, and a piezoelectric element including a first electrode, a piezoelectric layer formed above the first electrode and having a perovskite structure represented by the general formula $ABO_3$, and a second electrode formed above the piezoelectric layer, wherein the piezoelectric layer, lead, zirconium, and titanium are present at A sites of the perovskite structure, and lead, zirconium, and titanium are present at B sites of the perovskite structure.

7 Claims, 4 Drawing Sheets

LIQUID EJECTING HEAD, LIQUID EJECTING APPARATUS, AND ACTUATOR DEVICE

This application is a Continuation of U.S. patent application Ser. No. 12/573,654 filed on Oct. 5, 2009 which claims priority to Japanese Patent Application Nos. 2008-260105, filed Oct. 6, 2008 and 2009-160191 filed Jul. 6, 2009 which are expressly incorporated herein by reference.

BACKGROUND

1. Technical Field

The present invention relates to a liquid ejecting head provided with a piezoelectric element. More particularly, the present invention relates to a liquid ejecting head, liquid ejecting apparatus, and an actuator device provided with a piezoelectric element which includes a first electrode, a piezoelectric layer, and a second electrode and which produces a pressure change in a pressure generating chamber communicating with a nozzle opening.

2. Related Art

Piezoelectric elements used in liquid ejecting heads and the like each include a piezoelectric layer disposed between two electrodes and composed of a piezoelectric material exhibiting an electro-mechanical conversion function. A variety of materials may be used as the piezoelectric layer, included layers containing lead, zirconium, and titanium, for example, lead zirconate titanate (PZT) or the like, as disclosed in Japanese Unexamined Patent Application Publication No. 2001-223404.

However, when a piezoelectric element using the piezoelectric layers currently known in the art is used, a sufficient displacement has not been attained. This problem is not limited to liquid ejecting heads such as an ink jet recording head, and the problem is also present in actuator devices mounted on other apparatuses.

BRIEF SUMMARY OF THE INVENTION

An advantage of some aspects of the invention is that the invention provides a liquid ejecting head having high displacement characteristic, a liquid ejecting apparatus, and an actuator device.

A first aspect of the invention is liquid ejecting head comprising a pressure-generating chamber is formed which communicates with a nozzle opening and a piezoelectric element. The piezoelectric element includes a first electrode, a piezoelectric layer formed above the first electrode and having a perovskite structure represented by the general formula $ABO_3$, and a second electrode formed above the piezoelectric layer, and wherein the piezoelectric layer includes lead, zirconium, and titanium at the A sites and B sites of the perovskite structure.

In this configuration, lead, zirconium, and titanium are present at the A sites and B sites in the piezoelectric layer, meaning that a large displacement can be achieved at a low driving voltage. Namely, a high displacement characteristic can be obtained.

A second aspect of the invention is an actuator device comprising a first electrode, a piezoelectric layer formed above the first electrode and having a perovskite structure represented by the general formula $ABO_3$, and a second electrode formed above the piezoelectric layer, wherein the piezoelectric layer includes lead, zirconium, and titanium at the A sites and B sites of perovskite structure.

One advantage of the liquid ejecting head is that power may be saved while having an excellent liquid ejecting characteristic and one advantage of the actuator is that it has enhanced displacement characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

The present invention is described in detail below on the basis of an embodiment.

First Embodiment

Figure 1:
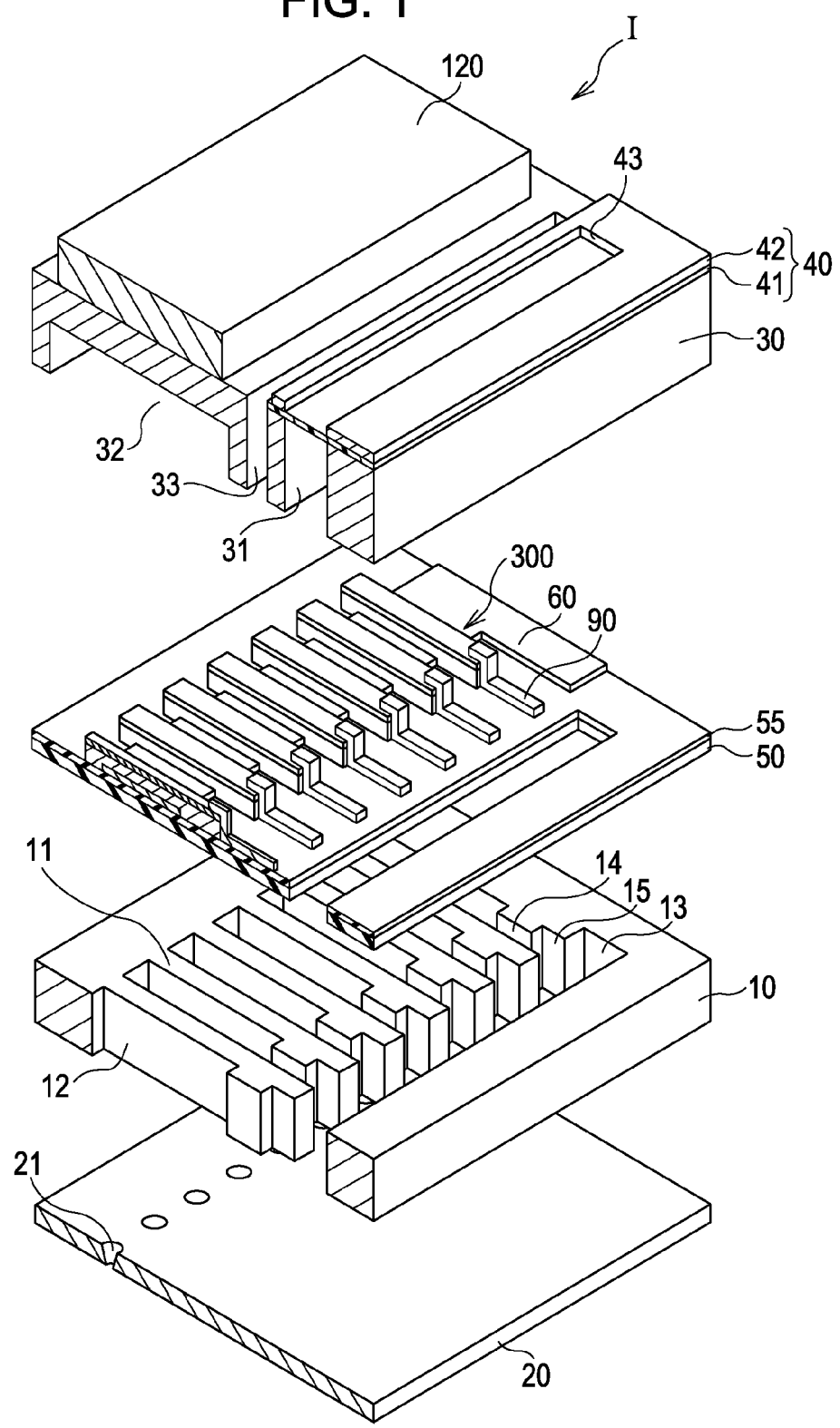
FIG. 1 is an exploded perspective view showing a schematic configuration of a recording head according to a first embodiment of the invention.
Figure 2A:
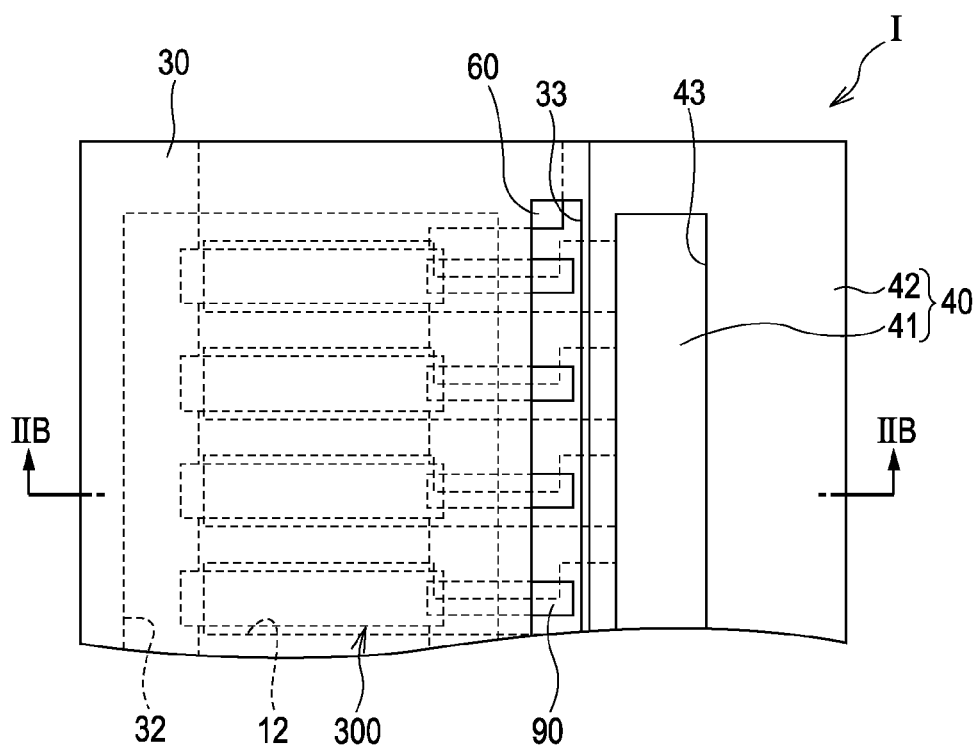
FIG. 2A is a plan view of the recording head according to a first embodiment of the invention.

FIG. 1 is an exploded perspective view showing a schematic configuration of an ink jet recording head I, which serves as an example of a liquid ejecting head according to a first embodiment of the present invention. FIG. 2A is a plan view of FIG. 1, and FIG. 2B is a sectional view taken along line IIB-IIB in FIG. 2A.

Figure 2B:
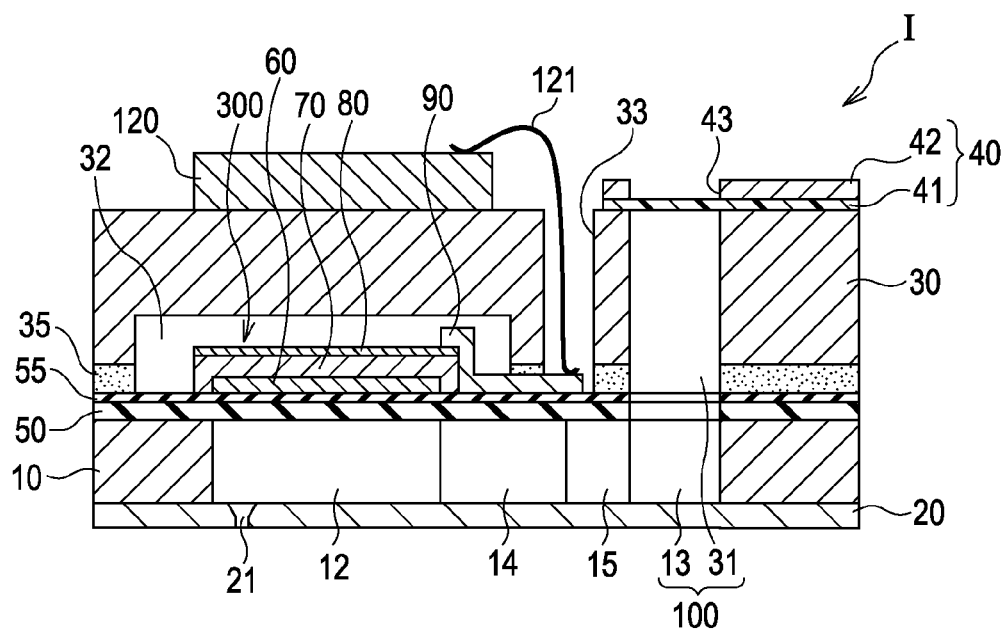
FIG. 2B is a sectional view of the recording head according to a first embodiment of the invention.

As shown in FIGS. 1, 2A, and 2B, a passage-forming substrate 10 of this embodiment includes a silicon single crystal substrate, and an elastic film 50 composed of silicon dioxide which is formed on one of the surfaces of the substrate 10.

The passage-forming substrate 10 has a plurality of pressure-generating chambers 12 provided in parallel in the width direction. In addition, the passage-forming substrate 10 includes a communicating portion 13 formed separate from the pressure-generating chambers 12 in the length direction thereof. The communicating portion 13 communicates with the pressure-generating chambers 12 through ink supply passages 14 and communicating passages 15 which are provided for the respective pressure-generating chambers 12. The communicating portion 13 communicate with a reservoir portion 31 of a protective substrate described below to in order to form a portion of a reservoir 100 which serves as a common ink chamber for the pressure-generating chambers 12. The ink supply passages 14 are formed so as to be narrower than the respective pressure-generating chambers 12 so that the passage resistance of ink flowing in the pressure-generating chambers 12 from the communicating portion 13 is maintained constant. Although, in this embodiment, the ink supply passages 14 are formed by narrowing the width of the passages from one side, the ink supply passages 14 may be formed by narrowing the width of the passages from both sides or narrowing in the thickness direction instead of narrowing in the width of the passages.

In the embodiment, liquid passages including the pressure-generating chambers 12, the communicating portion 13, the ink supply passages 14, and the communicating passages 15 are provided in the passage-forming substrate 10.

In addition, a nozzle plate 20 is fixed to the other side of the passage-forming substrate 10 with an adhesive, a heat-seal film, or the like. The nozzle plate 20 has a nozzle opening 21 formed to communicate with the pressure-generating chambers 12 opposite to the ink supply passage 14. The nozzle plate 20 is composed of, for example, glass ceramic, a silicon single crystal substrate, stainless steel, or the like.

On the other hand, as described above, the elastic film 50 is formed on the side opposite to the opening surface of the passage-forming substrate 10, and an insulator film 55 is formed on the elastic film 50. Further, a first electrode 60, a piezoelectric layer 70, and a second electrode 80 are laminated on the elastic film 50 to form a piezoelectric element 300. The first electrode 60, the piezoelectric layer 70, and the second electrode 80 are referred to collectively as the "piezoelectric element 300". Generally, one of the electrodes of the piezoelectric element 300 serves as a common electrode, while the other electrode and the piezoelectric layer 70 are patterned for each of the pressure-generating chambers 12. In this embodiment, the first electrode 60 serves as a common electrode of the piezoelectric element 300, and the second electrode 80 serves as an individual electrode. However, the electrodes may be reversed according to specific configuration of the driving circuit and wiring. Herein, a combination of the piezoelectric element 300 and a vibrating plate produce a displacement by driving the piezoelectric element 300, and are referred to collectively as an "actuator device".

In this embodiment, the elastic film 50, the insulator film 55, and the first electrode 60 function as the vibrating plate, but the invention is not so limited. For example, the elastic film 50 and the insulator film 55 may be excluded so that only the first electrode 60 functions as the vibrating plate. The piezoelectric element 300 may be allowed to also function as the vibrating plate.

The piezoelectric layer 70 is formed on the first electrode 60 and is composed of a metal oxide having a perovskite structure which has a polarized structure and which is represented by the general formula $ABO_3$. A number of materials may be used for the piezoelectric layer 70, such as, for example, a ferroelectric material such as lead zirconate titanate (PZT) or the like, a ferroelectric material containing a metal oxide such as niobium oxide, nickel oxide, magnesium oxide, or the like. Specific examples of acceptable materials include lead titanate ($PbTiO_3$), lead zirconate titanate ($Pb(Zr,Ti)O_3$), lead zirconate ($PbZrO_3$), lead lanthanum titanate (($Pb, La$)$TiO_3$), lead lanthanum zirconate titanate (($Pb, La$)($Zr, Ti$)$O_3$), lead magnesium niobate zirconium titanate ($Pb(Zr, Ti)(Mg, Nb)O_3$), and the like. In the embodiment, as the piezoelectric layer 70, PZT represented by the formula $Pb_x(Zr_yTi_{1-y})O_3$ in which x is larger than 1.0 and 1.3 or less, and y is not particularly limited but $0.4 \leq y \leq 0.6$ including a phase boundary is preferably used.

The piezoelectric layer 70 is composed of crystals preferentially oriented in a (100) plane and having a monoclinic crystal structure. The expression "crystals preferentially oriented in a (100) plane" includes the case where all crystals are oriented in a (100) plane and the case where most crystals (for example, 90% or more) are oriented in a (100) plane. In addition, in the present invention, the expression "having a monoclinic crystal structure" includes the case where all crystals have a monoclinic crystal structure and the case in which most crystals (for example, 90% or more) have a monoclinic crystal structure, where the residual crystals are rhombohedral or tetragonal.

Further, the piezoelectric layer 70 preferably has an engineered domain configuration in which a polarization direction is inclined at a predetermined angle (50° to 60°) with respect to a direction perpendicular to the film plane or the thickness direction of the piezoelectric layer 70.

In this embodiment, the piezoelectric layer 70 contains lead (Pb), zirconium (Zr), and titanium (Ti) at A sites, and lead (Pb), zirconium (Zr), and titanium (Ti) at B sites. Namely, the piezoelectric layer 70 according to the embodiment is represented by $Pb_x(Zr_yTi_{1-y})O_3$ in which basically, lead (Pb) is present at the A sites, and zirconium (Zr) or titanium (Ti) is present at the B sites. However, not only lead (Pb) but also zirconium (Zr) and titanium (Ti) are present at the A sites, and not only zirconium (Zr) and titanium (Ti) but also lead (Pb) are present at the B sites.

It is preferred that the amount of lead present at the A sites in the piezoelectric layer 7 is larger than the amount of zirconium present at the A sites and larger than the amount of titanium present at the A sites. Also, it is preferred that the amount of lead present at the B sites in the piezoelectric layer 7 is smaller than the amount of zirconium present at the B sites and smaller than the amount of titanium present at the B sites. The term "the amount of lead, zirconium, or titanium present at the sites" represents the number of elements present at the A sites or B sites, i.e., the abundance of each element.

The amount of lead and the amount of transition metals such as zirconium, titanium, and the like can be quantitatively analyzed using Induced Coupling Plasma (ICP) analysis. In the piezoelectric layer 70 of the embodiment, lead is excessively present in a thin film as compared with the transition metals, but a no diffraction peak is observed in X-ray diffraction analysis due to a hetero-phase. Therefore, in the piezoelectric layer 70 of the embodiment, excessive lead does not precipitate as a hetero-phase in the thin film, but is incorporated into not only the A sites but also the B sites of the perovskite structure.

The piezoelectric layer 70 of the present invention in which zirconium and titanium are present at the A sites can be formed by appropriately setting the deposition conditions of the piezoelectric layer 70, as described more fully below.

When lead, zirconium, and titanium are present at both the A sites and B sites of the piezoelectric layer 70 as described above, the in-plane lattice constants (a-axis, b-axis) of the piezoelectric layer 70 can be increased. In addition, the in-plane lattice constants (a-axis and b-axis) of the piezoelectric layer 70 are larger than the lattice constant (c-axis) in the direction perpendicular to this plane, i.e., the thickness direction. When the in-plane lattice constants of the piezoelectric layer 70 are increased, and the a-axis and b-axis lattice constants are made larger than the c-axis lattice constant, the piezoelectric layer 70 can produce a large displacement at a low driving voltage as described in detail below. Therefore, the piezoelectric layer 70 having a high displacement characteristic can be formed. From the viewpoint of the displacement characteristic, the amount of lead at the B sites is preferably 2.5% to 15%, more preferably 5% to 12.5%, relative to the amount of the transition metals. That is, a high piezoelectric displacement cannot be obtained out of this composition range (2.5% to 15%).

EXAMPLE 1

An elastic film 50 composed of silicon dioxide ($SiO_2$) having a thickness of 1000 nm and an insulator film 55 composed of zirconium dioxide ($ZrO_2$) having a thickness of 500 nm were provided on a silicon wafer preferentially oriented in the (100) plane. The elastic film 50 was formed by thermal oxidation, and the insulator film 55 was formed by depositing zirconium on the elastic film 50 by sputtering and then thermally oxidizing the deposited zirconium.

In addition, platinum (Pt) and iridium (Ir) were deposited in order on the insulator film 55 by sputtering to form a first electrode 60. In this case, the thickness of the first electrode 60 was 200 nm.

Then, a piezoelectric layer 70 composed of PZT was formed on the first electrode 60. As a method for producing the piezoelectric layer 70, a sol-gel method was used, in which a so-called sol prepared by dissolving and dispersing an organic metal compound in a solvent was applied and died to form a gel and then firing at a high temperature to form the piezoelectric layer 70 composed of a metal oxide.

Specifically, the piezoelectric film forming step included a coating step where a composition liquid of PZT containing lead at a ratio of 1.18 to the transition metals (Zr+Ti) is applied, a drying step where the composition liquid to form a piezoelectric precursor film is dried, a degreasing step where the dried piezoelectric precursor film is degreased at a temperature of 410° C., and a firing step where the degreased piezoelectric precursor film is fired by heating the film three times in an 100% oxygen atmosphere at 650° C. for 30 seconds using a RTA (Rapid Thermal Annealing) apparatus of heating by irradiation of an infrared lamp in order to form a crystallized piezoelectric film. The piezoelectric film forming step was repeated to form the piezoelectric film 70 including a laminate of a plurality of piezoelectric layers having a total thickness of about 1.1 μm. The piezoelectric film forming step was performed once each time the composition liquid was applied to a thickness of 100 nm in the coating step. In addition, the piezoelectric film forming step was performed in an atmosphere of a relative humidity of 40% RH.

The term "degreasing" represents a process where the organic components contained in the piezoelectric precursor film are removed, such as, for example, $NO_2$, $CO_2$, $H_2O$, and the like, to the extent that the piezoelectric precursor film is not crystallized, i.e., an amorphous piezoelectric precursor film is formed.

Then, a second electrode 80 composed of iridium (Ir) having a thickness of 200 nm was formed on the piezoelectric layer 70.

EXAMPLE 2

An elastic film 50, an insulator film 55, and a first electrode 60 were formed on a silicon wafer by the same method as in Example 1, and then a piezoelectric layer 70 was formed by a sol-gel method.

In Example 2, when a piezoelectric film constituting the piezoelectric layer 70 was formed, a composition liquid was applied to a thickness of 200 nm in the coating step, and firing was performed by heating once at 700° C. for 60 seconds using a RTA apparatus. The composition liquid contained lead at a ratio of 1.18 to the transition metals. The degreasing step was performed at 380° C., and the piezoelectric film forming step was performed at a relative humidity of 70% RH. The piezoelectric layer 70 was formed to the same thickness as in Example 1, i.e., a thickness of about 1.1 μm. Then, a second electrode 80 was formed on the piezoelectric layer 70 by the same method as in Example 1.

Test Results

A voltage was applied to each of the piezoelectric elements of Examples 1 and 2, and a displacement was measured using a laser displacement meter.

For each of the piezoelectric elements of Examples 1 and 2, the lattice constants were measured from X-ray diffraction peaks measured by an X-ray diffraction method.

Further, for each of the piezoelectric elements of Examples 1 and 2, a Raman shift of each vibrational mode in a PZT lattice was measured by Raman scattering. That is, in a Raman shift produced by Raman scattering measured using a He—Cd laser (wavelength 325 nm) as a pump laser, a peak position (B1 peak shift amount) of A1 (2T0) showing a vibrational mode of the A sites and a peak position (A1 peak shift amount) of A1 (3L0) showing a vibrational mode of the B sites were measured. The term "Raman shift" represents a difference in the wave number between incident light and Raman scattering light. In the embodiment, Raman scattering was measured in a room temperature unpolarized back scattering environment. The results are shown in Table 1.

TABLE 1

|  | Example 1 | Example 2 |
| --- | --- | --- |
| Displacement | 460 nm | 430 nm |
| a-Axis lattice constant | 4.18 Å | 4.17 Å |
| c-Axis lattice constant | 4.15 Å | 4.14 Å |
| B1 peak shift amount | +5 $cm^{-1}$ | 0 $cm^{-1}$ |
| A1 peak shift amount | −1 $cm^{-1}$ | 0 $cm^{-1}$ |

Table 1 indicates that the displacement of the piezoelectric element of Example 1 is larger than that of the piezoelectric element of Example 2.

With respect to the B1 peak shift amount and A1 peak shift amount due to Raman scattering, the peak shift amounts of Example 1 relative to those of Example 2 were calculated on the basis of Example 2 (0 $cm^{-1}$). As a result, in the piezoelectric layer of Example 1, the B1 peak shift amount showing a vibrational mode of the A sites is +5 $cm^{-1}$, and the A sites are substantially light. In the piezoelectric layer of Example 1, the A1 peak shift amount showing a vibrational mode of the B sites is −1 $cm^{-1}$, and the B sites are substantially heavy. That is, in the piezoelectric layer of Example 1, zirconium (Zr) and titanium (Ti) which are light cations other than lead (Pb) position at the A sites. In addition, in the piezoelectric layer of Example 1, heavy lead (Pb) other than zirconium (Zr) and titanium (Ti) position at the B sites.

Further, the in-plane (a axis) lattice constant of the piezoelectric layer of Example 1 is larger than Example 2, and the in-plane (a axis) lattice constants of the piezoelectric layers of both Examples 1 and 2 are larger then the lattice constants in the thickness direction (c axis).

With respect to these test results, electronic-state simulation (first-principle calculation) was performed for the case in which A-site lead (Pb) was exchanged with the B-site transition metal (exchange structure). The results of the electronic-state simulation are shown in FIGS. 3A to 3C.

The conditions of the electronic-state simulation were as follows: A density functional method was performed within the range of local density approximation using a ultra-soft pseudopotential method. The cutoff energy and electron density were 20 Hartree and 180 Hartree, respectively. For an $ABO_3$ cell, a 2×2×2 super cell was formed, and the meshes of reciprocal lattice points (k points) were (2×2×2). In consideration of a paraelectric phase near an actual crystal growth temperature of 700° C., the atom positions were assumed to be in the paraelectric state. The ratio of atom exchange was 12.5%, but changes in the lattice constant can be linearly approximated as shown in FIG. 3C. The lattice constant is shown in terms of one $ABO_3$ cell. The total energy includes only energy contributed by the valence band. Also, the total energy is shown by a value in terms of one $ABO_3$ cell.

Figure 3A:
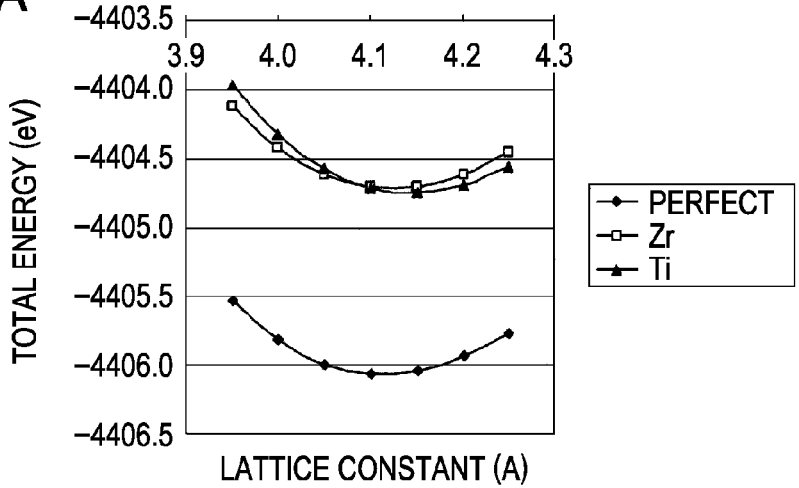
FIGS. 3A to 3C are graphs each showing the results of simulation of an electronic state according to the first embodiment of the invention.
Figure 3B:
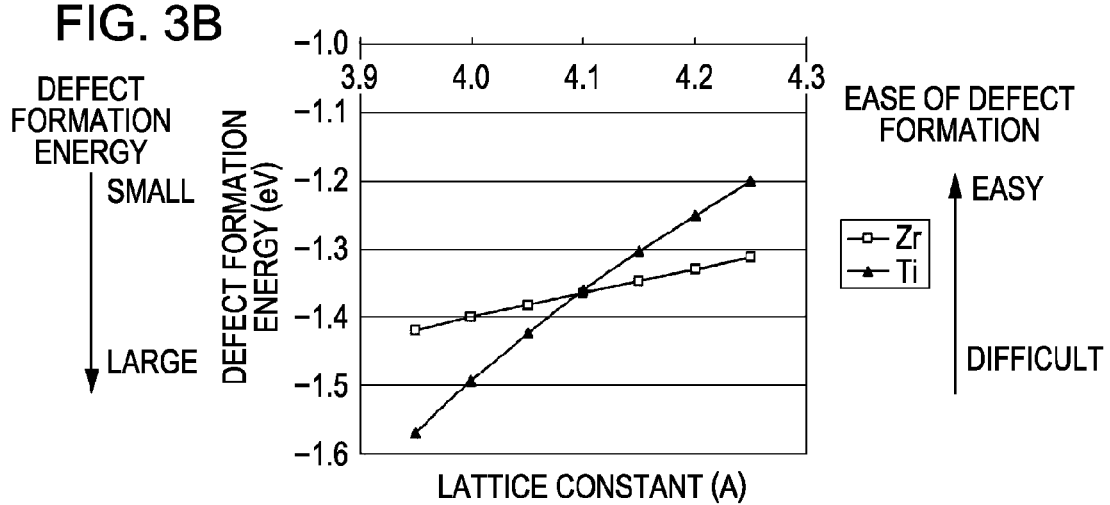
Figure 3C:
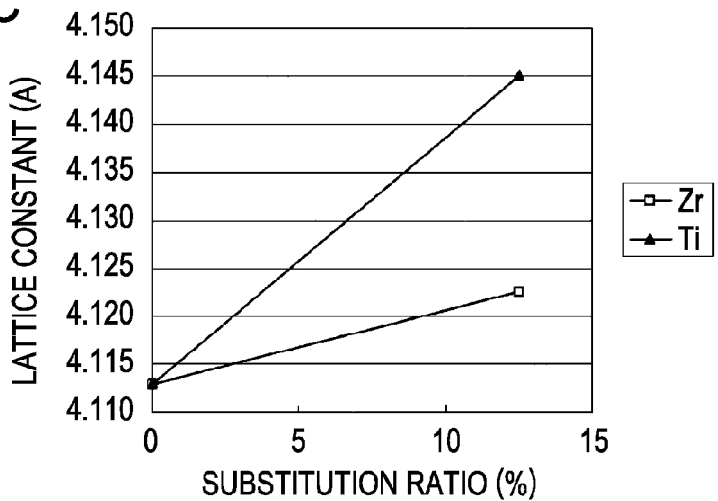

FIG. 3A shows a relationship between the lattice constant and total energy of $ABO_3$. In the figure, "Perfect" indicates complete crystals without atomic exchange. Namely, "Perfect" corresponds to $Pb(Zr_{0.5}Ti_{0.5})O_3$ without excessive lead and atomic exchange. In the figure, "Zr" denotes a structure in which A-site Pb is exchanged with B-site Zr, and "Ti" denotes a structure in which A-site Pb is exchanged with B-site Ti. The ratio of exchange in each of the structures is 12.5%. FIG. 3A indicates that the total energy is increased by about 1.2 to 1.6 eV by atomic exchange. This is because predetermined energy is required for atomic exchange. In the graph, the minimum value corresponds to the stable lattice constant. FIG. 3A shows that the lattice constant of perfect crystal is increased by atomic exchange. If an atomic exchange structure is regarded as a defect of a crystal structure, defect formation energy is defined by the following equation (1):

$$\text{(Defect formation energy)}=\text{(Perfect)}-\text{(Exchange structure)} \quad (1)$$

FIG. 3B shows a relationship between the lattice constant and defect formation energy for atomic exchange. FIG. 3B indicates that in the lattice constant region of 4.1 Å or more, exchange of A-site Pb with B-site Ti produces smaller defect formation energy as compared with exchange with Zr. As shown in FIG. 3C, since the stable lattice constant is 4.11 Å to 4.145 Å, atomic exchange with Ti is easier than exchange with Zr. Namely, the piezoelectric layer 70 containing a large amount of Ti at the A sites can be relatively easily formed.

Table 1 shows that a difference between the lattice constants of Examples 1 and 2 is 0.01 Å. As seen from FIG. 3C, the change of 0.01 Å corresponds to an atomic exchange ratio of 4%. That is, in Example 1, atomic exchange takes place 4% more than in Example 2.

The electronic-state simulation indicates that when A-site lead in the piezoelectric layer is exchanged with B-site zirconium and titanium, the lattice constant is changed and that the lattice constant increases as the amount of zirconium and titanium at the A sites increases.

The above-mentioned results indicate that when lead, zirconium, and titanium are present at the A sites and B sites, the lattice constant can be increased-particularly the in-plane (a-axis) lattice constant. In addition, when the lattice constant is increased, as shown in Table 1, a large displacement can be achieved at a low driving voltage. Thus, the piezoelectric layer 70 having high displacement characteristic can be formed. It is considered that a piezoelectric layer having ideal composition and crystal structure in which only lead is present at the A sites, zirconium and titanium are present at the B sites, and the ratio of lead to zirconium and titanium is 1:1 generally has high displacement characteristic. However, in fact, the above-described test results show that when lead, zirconium, and titanium are present at the A sites and B sites, the high displacement characteristic can be achieved.

In addition, as described above, substitution of elements at the A sites and the B sites in the piezoelectric layer 70 is determined by various conditions for forming the piezoelectric layer.

The thickness of the piezoelectric layer 70 is suppressed so that that no cracks occur in the production process, while being sufficiently large so that sufficient displacement characteristic is exhibited. For example, in the embodiment, the piezoelectric layer 70 is preferably formed to a thickness of about 1 to 2 μm.

Although the embodiments described above used the sol-gel method to produce the piezoelectric layer 70, the invention is not limited to the above-described sol-gel method, and, for example, MOD (Metal-Organic Decomposition) method, a sputtering method, or the like may be used.

Further, the second electrode 80 is composed of, for example, iridium (Ir) having a thickness of 200 nm. The second electrode 80 functions as an individual electrode of the piezoelectric element 300. Further, a lead electrode 90 composed of, for example, gold (Au) is connected to the second electrode 80, the lead electrode 90 being drawn out from the vicinity of the end on the ink supply passage side and extended to the insulator film 55.

In addition, a protective substrate 30 having a reservoir portion 31 which constitutes at least a portion of a reservoir 100 is bonded to the passage-forming substrate 10 on which the piezoelectric element 300 is formed, i.e., placed on the first electrode 60, the insulator film 55, and the lead electrode 90, through an adhesive 35. In this embodiment, the reservoir portion 31 is formed to pass through the protective substrate 30 in the thickness direction and extend in the width direction of the pressure-generating chambers 12. As described above, the reservoir portion 31 communicates with the communicating portion 13 of the passage-forming substrate 10 to form the reservoir 100 serving as a common ink chamber of the pressure-generating chambers 12. The communicating portion 13 may be divided into a plurality parts for the respective pressure-generating chambers 12 so that only the reservoir portion 31 is used as a reservoir. Further, for example, only the pressure-generating chambers 12 may be provided in the passage-forming substrate 10, and the ink supply passages 14 may be provided in a member, such as the elastic film 50, the insulator film 55, or the like, interposed between the passage-forming substrate 10 and the protective substrate 30 so that the reservoir communicates with the pressure-generating chambers 12.

Further, a piezoelectric element holding portion 32 is provided in a region of the protective substrate 30, which faces the piezoelectric elements 300, the piezoelectric element holding portion 32 having a space which does not inhibit the motion of the piezoelectric elements 300. This space may be sealed or not sealed.

As the protective substrate 30, a material having substantially the same thermal expansion coefficient as the passage-forming substrate 10, for example, glass, a ceramic material, or the like, is preferably used. In this embodiment, the same material as the passage-forming substrate 10, i.e., a silicon single crystal substrate, is used.

In addition, a through hole 33 is provided in the protective substrate 30 so as to pass through the protective substrate 30 in the thickness direction. The vicinity of the end of the lead electrode 90 drawn out from each of the piezoelectric elements 300 is exposed in the through hole 33.

Further, a driving circuit 120 is fixed on the protective substrate 30, for driving the parallel piezoelectric elements 300. As the driving circuit 120, for example, a circuit board, a semiconductor integrated circuit (IC), or the like can b used. The driving circuit 120 is electrically connected to the lead electrodes 90 through connecting wiring 121 composed of a conductive wire such as a bonding wire or the like.

Further, a compliance substrate 40 including a sealing film 41 and a fixing plate 42 is bonded to the protective substrate 30. The sealing film 41 is composed of a material having low rigidity and flexibility and seals one of the sides of the reservoir portion 31. The fixing plate 42 is composed of a relatively hard material. The region of the fixing plate 42, which faces the reservoir 100, is an opening 43 where the fixing plate 42 is completely removed in the thickness direction, and thus one side of the reservoir 100 is sealed with only the sealing film 41 having flexibility.

In the ink jet recording head of the embodiment, an ink is introduced through an ink inlet connected to an external ink supply unit (not shown) to fill the inside ranging from the reservoir 100 to the nozzle openings 21. Then, a voltage is applied between the first electrode 60 and the second electrode 80 corresponding to each of the pressure-generating chambers 12 according to a recording signal from the driving circuit 120 to flexurally deform the elastic film 50, the insulator film 55, the first electrode 60, and the piezoelectric layer 70. Consequently, the pressure in each of the pressure-generating chambers 12 is increased and ink droplets are ejected from the nozzle openings 21.

Other Embodiments

Although an embodiment of the present invention is described above, the basic configuration of the present invention is not limited to the examples described herein. For example, although, in the first embodiment, a silicon single crystal substrate is used as the passage-forming substrate 10, the passage-forming substrate 10 is not so limited, and a silicon single crystal substrate having crystal plane orientation of (100), (110), or the like may be used, or a SOI substrate, a glass substrate, or the like may be used.

In addition, in the above-described first embodiment, the first electrode 60 is composed of, for example, iridium oxide formed by laminating platinum (Pt) and iridium (Ir) and then heating when the piezoelectric layer 70 is formed. However, the first electrode 60 is not limited to this configuration.

Figure 4:
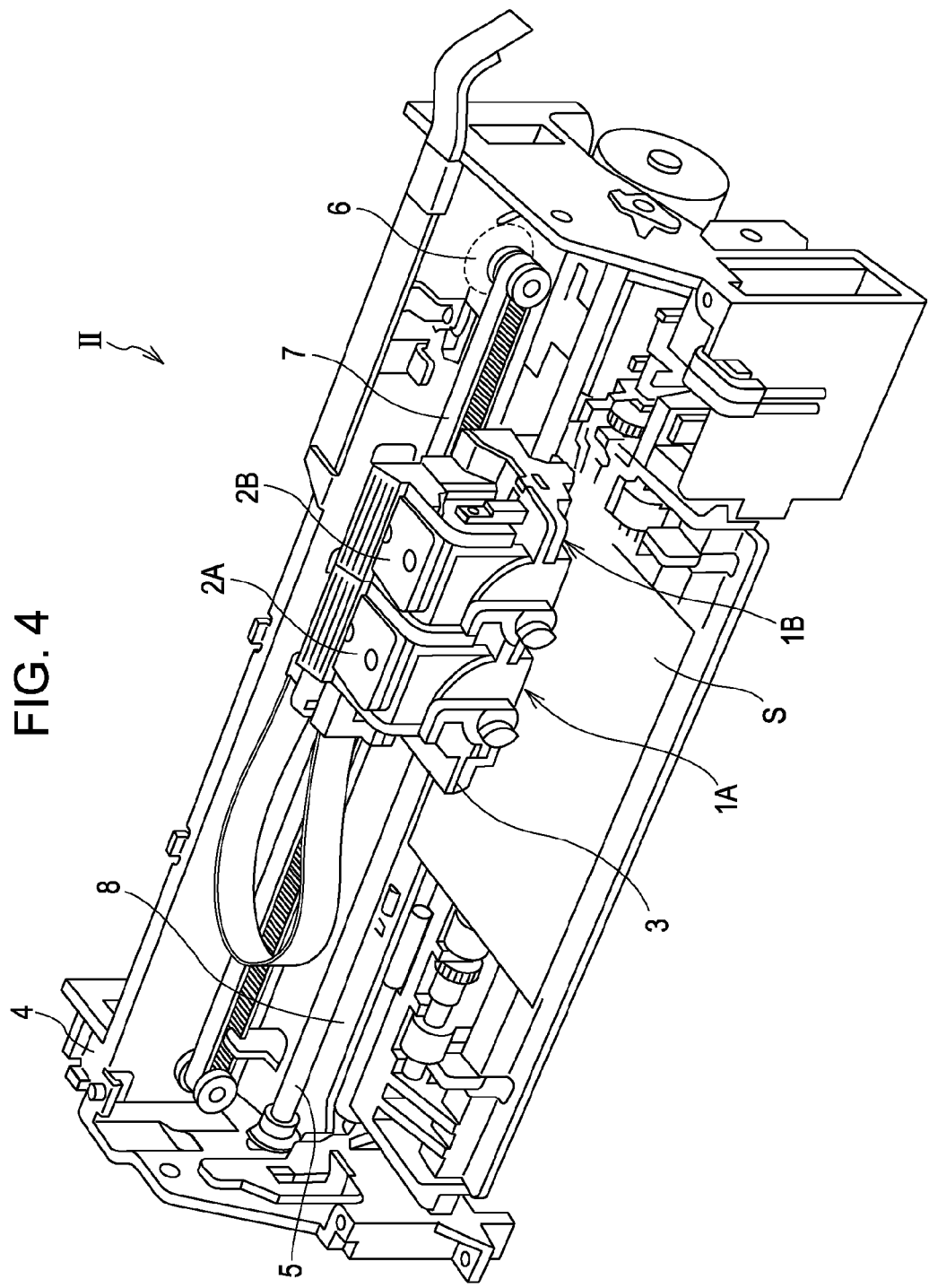
FIG. 4 is a schematic view of a recording apparatus according to an embodiment of the invention.

Further, the ink jet recording head of the first embodiment is mounted on an ink jet recording apparatus so as to constitute a portion of a recording head unit having an ink passage communicating with an ink cartridge or the like. FIG. 4 is a schematic view showing an example of the ink jet recording apparatus.

In an ink jet recording apparatus 11 shown in FIG. 4, cartridges 2A and 2B constituting ink supply units are detachably provided on recording head units 1A and 1B each including the ink jet recording head 1, and a carriage 3 provided with the recording head units 1A and 1B is provided on a carriage shaft 5 attached to the apparatus body 4 so that the carriage 3 can be moved in the shaft direction. For example, the recording head units 1A and 1B eject a black ink composition and a color ink composition, respectively.

When driving force of a driving motor 6 is transmitted to the carriage 3 through a plurality of gears (not shown) and a timing belt 7, the carriage 3 provided with the recording head units 1A and 1B is moved along the carriage shaft 5. On the other hand, a platen 8 is provided along the carriage shaft 5 of the apparatus body 4 so that a recording sheet S serving as a recording medium such as paper or the like, which is supplied through a paper feed roller (not shown), is wound on the platen 8 and transported.

Although, in the first embodiment, the ink jet recording head is described as an example of a liquid ejecting apparatus, the present invention is intended for liquid ejecting heads of a variety of uses and, of course, can be applied to liquid ejecting heads which eject liquids other than ink. Examples of other liquid ejecting heads include various recording heads used in image recording apparatuses such as a printer, colorant ejecting heads used for manufacturing color filters of a liquid crystal display and the like, electrode material ejecting heads used for forming electrodes of an organic EL display, FED (field emission display), and the like, biological organic material ejecting heads used for producing bio-chips, and the like.

In addition, the present invention can be applied to not only piezoelectric elements mounted on liquid ejecting heads such as an ink jet recording head but also piezoelectric elements mounted on other apparatuses.

What is claimed is:

1. A piezoelectric element comprising:
   a first electrode;
   a piezoelectric layer formed above the first electrode and having a perovskite structure represented by the general formula $ABO_3$; and
   a second electrode formed above the piezoelectric layer;
   wherein lead, zirconium, and titanium are present at A sites in the piezoelectric layer, and lead, zirconium, and titanium are present at B sites in the piezoelectric layer.

2. The piezoelectric element according to claim 1, wherein the amount of lead present at the A sites in the piezoelectric layer is larger than the amount of zirconium present at the A sites and larger than the amount of titanium present at the A sites.

3. The piezoelectric element according to claim 1, wherein the amount of lead present at the B sites in the piezoelectric layer is smaller than the amount of zirconium present at the B sites and smaller than the amount of titanium present at the B sites.

4. The piezoelectric element according to claim 1, wherein the piezoelectric layer is oriented in a (100) plane and has a monoclinic structure.

5. The piezoelectric element according to claim 1, wherein the amount of titanium present at the A sites in the piezoelectric layer is larger than the amount of zirconium present at the A sites in the piezoelectric layer.

6. The piezoelectric element according to claim 1, wherein the amount of a transition metal present at the A sites in the piezoelectric layer is 4% or more of the whole of the A sites.

7. The piezoelectric element according to claim 1, wherein the amount of lead present at the B sites in the piezoelectric layer is 2.5% to 15%.

* * * * *